(12) United States Patent
Detlefsen et al.

(10) Patent No.: US 9,247,351 B2
(45) Date of Patent: Jan. 26, 2016

(54) ELECTROACOUSTIC BANDPASS FILTER HAVING SMOOTHED INSERTION LOSS

(71) Applicant: EPCOS AG, Munich (DE)

(72) Inventors: Andreas Detlefsen, Eichenau (DE); Mohamed Nizar Mellouli, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/646,496

(22) PCT Filed: Oct. 17, 2013

(86) PCT No.: PCT/EP2013/071746
§ 371 (c)(1),
(2) Date: May 21, 2015

(87) PCT Pub. No.: WO2014/090451
PCT Pub. Date: Jun. 19, 2014

(65) Prior Publication Data
US 2015/0319536 A1 Nov. 5, 2015

(30) Foreign Application Priority Data
Dec. 13, 2012 (DE) .......................... 10 2012 112 237

(51) Int. Cl.
*H04R 3/00* (2006.01)
*H04R 17/00* (2006.01)

(52) U.S. Cl.
CPC .................................... *H04R 17/00* (2013.01)

(58) Field of Classification Search
CPC ..................... H04R 3/00; H04R 17/02; H04R 2217/00–2217/03; H04R 19/00–19/01; H04R 19/013; H04R 19/016; G10K 11/16
USPC .......... 381/71.1–14, 111, 113–114, 190–191, 381/173
See application file for complete search history.

(56) References Cited

U.S. PATENT DOCUMENTS

| 6,504,454 | B2 | 1/2003 | Takahashi |
| 6,894,588 | B2 | 5/2005 | Detlefsen |
| 7,999,636 | B2 | 8/2011 | Bauer et al. |
| 2004/0130411 | A1 | 7/2004 | Beaudin et al. |
| 2005/0099247 | A1 | 5/2005 | Kidoh |
| 2005/0190014 | A1 | 9/2005 | Saitou et al. |

FOREIGN PATENT DOCUMENTS

| DE | 60127351 T2 | 7/2007 |
| DE | 102006010752 A1 | 9/2007 |
| WO | 2005027535 A2 | 3/2005 |

*Primary Examiner* — Suhan Ni
(74) *Attorney, Agent, or Firm* — Slater & Matsil, L.L.P.

(57) ABSTRACT

A bandpass filter operates with electroacoustically active components. The bandpass filter includes a first transducer segment having a spike in the insertion loss at a first frequency $f_1$ and a second transducer segment having a spike in the insertion loss at a second frequency $f_2 \neq f_1$. The frequencies $f_1$ and $f_2$ are chosen such that the insertion loss is smoothed.

16 Claims, 8 Drawing Sheets

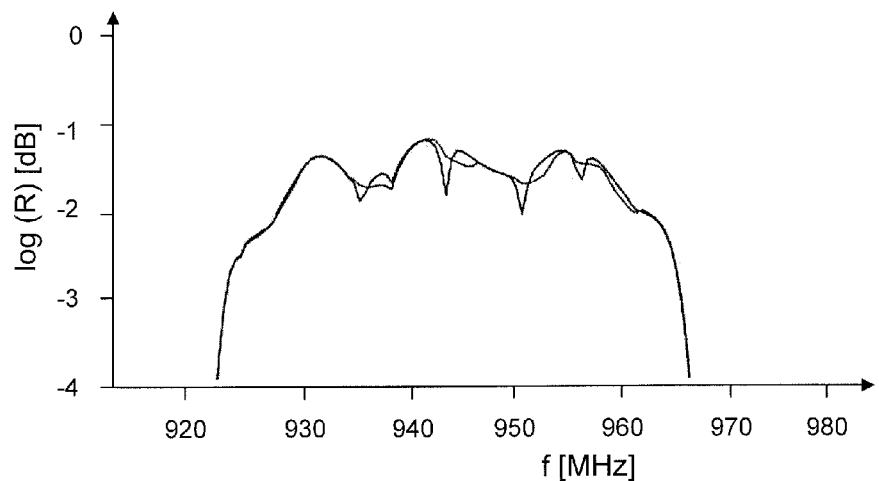
Fig. 18
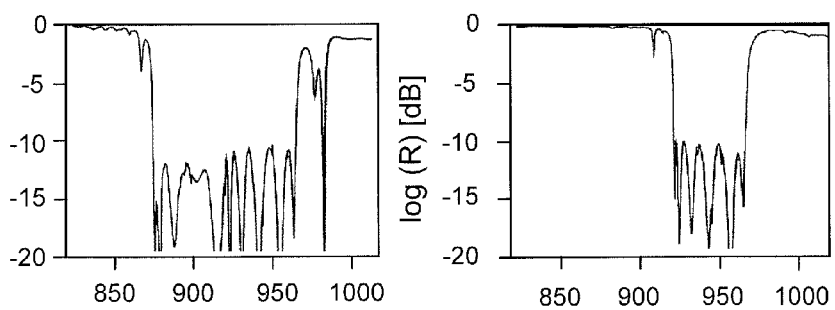
Fig. 19
Fig. 20

ELECTROACOUSTIC BANDPASS FILTER HAVING SMOOTHED INSERTION LOSS

This patent application is a national phase filing under section 371 of PCT/EP2013/071746, filed Oct. 17, 2013, which claims the priority of German patent application 10 2012 112 237.7, filed Dec. 13, 2012, each of which is incorporated herein by reference in its entirety.

TECHNICAL FIELD

The invention relates to electroacoustic bandpass filters having smoothed insertion loss, such as can be used, e.g., in front-end circuits of mobile communication devices.

BACKGROUND

In mobile communication devices, bandpass filters serve for selecting desired frequency ranges for diverse signal paths. The desired frequency ranges can pass through the filter, while undesired frequency ranges are blocked.

US Patent Application Publication No. 2004/0130411 A1 discloses band-stop filters comprising electroacoustically active components.

U.S. Pat. No. 6,894,588 likewise discloses electroacoustic components, e.g., for improving adjacent channel selectivity.

SUMMARY

The desired frequency range—the passband—should have an insertion loss that is as low and smooth as possible. In contrast to the band-stop filters in US Patent Application Publication No. 2004/0130411 A1, the ripple of the insertion loss in the passband plays an important part.

Embodiments of the present invention specify a bandpass filter having low and smooth insertion loss in the passband.

The features specified below can interact here in any desired combination to yield an individually adapted bandpass filter.

The electroacoustic bandpass filter comprises a piezoelectric layer having an acoustic track. The filter furthermore comprises a metallization layer, which is arranged on the piezoelectric layer and in the acoustic track. The acoustic track comprises a first section and a second section. In the first section a first transducer segment is formed in the metalized layer, which first transducer segment forms a resonance at a first frequency $f_1$ and generates a spike in the insertion loss. In the second section a second transducer segment is formed in the metalized layer, which second transducer segment forms a resonance at a second frequency $f_2 \neq f_1$ and generates a spike in the insertion loss. The frequencies $f_1$ and $f_2$ are chosen such that the manifestation of the spikes in the insertion loss of the filter is reduced compared with the manifestation of the spikes of the individual transducers.

Such a bandpass filter thus makes it possible to reduce spikes, that is to say narrowband resonances, in the transfer function. Since the reduction of the ripple in the passband makes it possible to keep the electrical power lower overall, the power compatibility of the filter is thus also improved. As a result of the reduction of spikes, less power is deposited in the filter, and so the lifetime is increased. Furthermore, on account of the reduction of the required electrical power, the linear behavior of the filter, that is to say the reduction of nonlinear effects, is also improved. Consequently, the bandpass filter also contributes to reducing disturbances resulting from intermodulation products (IMD=intermodulation distortion) and disturbances resulting from undesired higher harmonics.

The piezoelectric layer, in which the acoustic track is formed, can be a piezoelectric layer on a carrier substrate or else a piezoelectric substrate itself. In this case, the acoustic track is that area of the piezoelectric layer in which acoustic waves can be excited and/or are capable of propagation. The acoustic track is therefore substantially the acoustically active region of the filter. The metalized layer is that layer in which electrode structures or reflectors are formed in the acoustic track. The electrode structures can convert in particular between electromagnetic RF signals and acoustic waves. Appropriate acoustic waves include, in particular, surface acoustic waves (SAW) or guided bulk acoustic waves (GBAW).

The first section having the first transducer segment and the second section having the second transducer segment can directly adjoin one another or be arranged in a spatially separated manner. In any case, the two sections can be arranged on one and the same chip substrate. Furthermore, the first transducer segment and the second transducer segment can be arranged in the same transducer or in different transducers.

In one embodiment, the first and second transducer segments are accordingly segments of different, slightly frequency-offset transducers. The bandpass filter then comprises at least two transducers which are arranged in an electroacoustic region on a piezoelectric layer and are frequency-offset, e.g., by means of different distances between the midpoints of the excitation centers, e.g., the electrode fingers. The term pitch denotes the distance between the excitation centers. The two segments can accordingly have a slightly different pitch.

In this regard, it is also possible to provide a ladder-type filter having parallel branch resonators and series branch resonators, wherein at least two different parallel branch resonators and/or series branch resonators have a frequency offset. In this regard, undesired resonances above (parallel branch) and/or below (series branch) the resonant frequency can be reduced, e.g., in the case of filters comprising LiNbO$_3$ (lithium niobate) or LiTaO$_3$ (lithium tantalate) as piezoelectric material.

In one embodiment, the first transducer segment and the second transducer segment are two segments of the same transducer.

In this case, the transducer can be a transducer with a common busbar between two partial transducers that are cascaded relative to one another. However, it is also possible for one and the same transducer, e.g., a FAN-type transducer, to have the two different segments having a different pitch. A FAN-type transducer, in particular, can have over and above that a continuum of virtually juxtaposed infinitesimally narrow segments having different pitches and can thus constitute a transducer having a pitch gradient.

FAN-type transducers are known from US Patent Application Publication No. 2004/0130411 A1, for example. However, known FAN-type transducers are not provided for generating different spikes in the insertion loss which mutually compensate for one another.

In one embodiment, the first transducer segment and the second transducer segment are accordingly two segments of one and the same FAN-type transducer.

In one embodiment, the filter is a SAW filter or a GBAW filter.

In one embodiment, the first transducer segment and the second transducer segment are arranged in a first transducer.

The bandpass filter furthermore comprises a second transducer and is a DMS filter or a multi-port resonator filter.

The provision of different frequencies $f_1$ and $f_2$, wherein the insertion loss has corresponding spikes at these frequencies, is suitable particularly in the case of DMS or multi-port resonator filters, since here a multiplicity of electroacoustically active transducer structures are arranged within an individual resonator structure and acoustically coupled to one another.

The corresponding DMS tracks or the tracks of multi-port resonator filters can be conceptually subdivided into track segments having different pitches and having electrical properties scaled in terms of frequency with respect to one another. This leads to a "smoothing" of individual spikes in the entire transfer function.

In one embodiment, the bandpass filter furthermore comprises a FAN-type reflector. In this case, a FAN-type reflector is a structured structure which is arranged on the piezoelectric layer and which reflects acoustic waves. As reflective structure, it can comprise in particular a multiplicity of structured strips arranged one behind another, wherein the strips diverge in the transverse direction according to the FAN principle. In this case, the transverse direction is that direction which runs parallel to the surface of the piezoelectric layer and is perpendicular to the direction of propagation of the acoustic waves, the longitudinal direction.

In one embodiment, the FAN-type transducer or a FAN-type reflector has a pitch scaling of between 500 ppm and 2000 ppm. For two finger structures running alongside one another, the distance between the fingers in the transverse direction therefore changes from 0.05 to 0.2%. The pitch can be varied here in the case of a constant or likewise variable metallization ratio.

It is also possible for the pitch scaling to be other values. Other values are possible particularly in the case of resonators in a parallel branch. The pitch scaling of series branch and parallel branches can then be chosen differently. A further degree of freedom in the design of filter structures is therefore obtained.

In one embodiment, the filter is a DMS filter. The two segments are segments of the same transducer, which is a partial FAN-type transducer or complete FAN-type transducer.

In this case, a partial FAN-type transducer is a transducer which has electrode fingers running parallel in a first section, that is to say in one of the two segments. In a second section, that is to say in the other of the two segments, the pitch changes continuously, by contrast, in the transverse direction.

In contrast thereto, a complete FAN-type transducer is a transducer in which the pitch changes continuously in the transverse direction in the entire transducer region.

In one embodiment, the bandpass filter comprises a third transducer alongside a first and a second transducer. The first, second and third transducers are FAN-type transducers. Two of the transducers are output transducers and one of the transducers is arranged between the output transducers and is an input transducer.

Such a transducer structure thus has two electrical inputs and one electrical output. The terms input and output are interchangeable here. The individual terminal can in this case be an input, while the other two terminals are two outputs.

A transducer structure having BALUN functionality (BALUN—BALanced—UNbalanced transducer) can, thus, be obtained.

In one embodiment of the bandpass filter, the piezoelectric layer has an underside which at least partly reflects bulk acoustic waves. A transducer of the filter is configured as a FAN-type transducer and provided for scattering bulk acoustic waves in order to reduce the ripple of the insertion loss.

Generally, an underside of a component having a bandpass filter function which reflects bulk waves is undesirable since bulk waves radiated from the reflective underside interfere with surface waves at the surface and disturb the functionality of the filter.

It is possible for the underside to be configured with a material which absorbs bulk waves. However, the continuous trend toward more extensive miniaturization of electrical components demands ever thinner substrates. One way of obtaining a thin substrate here is to grind away substrate material from the underside. Since the mechanical stability depends on the thickness of the substrate, such thinning brings about a reduction of the mechanical stability. The arrangement of structures which absorb or scatter bulk waves therefore entails the risk of destruction of the component in the case of particularly thin substrates. As a result of the envisaged possibility for destructive interference of spikes of the two frequencies $f_1$, $f_2$, the problem of disturbances resulting from bulk waves reflected at the underside can therefore be reduced solely by means of structures at the top side of the component. The risk of destruction during the production of the components is therefore reduced because the corresponding structures are produced before thinning and are not destroyed by the thinning itself.

In one embodiment, the two transducers are cascaded and the cascade stages are interconnected in series or in parallel. In this case, the two transducers comprise the two segments having spikes at different frequencies. In this case, the different frequencies of the spikes can be obtained by means of a correspondingly adapted pitch of the two cascaded transducers.

In one embodiment, these two transducers are part of a resonator cascade with a common busbar. The two transducers comprising the two segments are therefore arranged in a manner directly adjoining one another on the piezoelectric layer, which enables a very space-saving design of a filter structure.

In one embodiment, the bandpass filter comprises a parallel branch transducer having a pitch $P_2$. One of the two transducer segments is furthermore arranged in a series branch transducer and has a pitch $P_1$. The following holds true in this case: $P_2 > P_1$.

In one embodiment, the two frequencies $f_1$ and $f_2$ are selected such that undesired Fabry-Perot resonances are reduced.

It has been recognized that Fabry-Perot resonances can cause undesired resonances also in the passband of a bandpass filter and can thus increase the ripple of the insertion loss. By virtue of the choice of the frequencies $f_1$ and $f_2$, the spikes assigned to Fabry-Perot resonances can be destructively superimposed on one another and thus compensate for one another.

BRIEF DESCRIPTION OF THE DRAWINGS

The bandpass filter is explained in greater detail below on the basis of exemplary embodiments and associated schematic figures, in which:

FIG. 18 shows an excerpt from the curve in FIG. 17;

FIG. 19 shows the adaptation of a corresponding filter structure into an external circuit environment; and FIG. 20 shows the adaptation of a corresponding filter structure into an external circuit environment.

DETAILED DESCRIPTION OF ILLUSTRATIVE EMBODIMENTS

Figure 1:
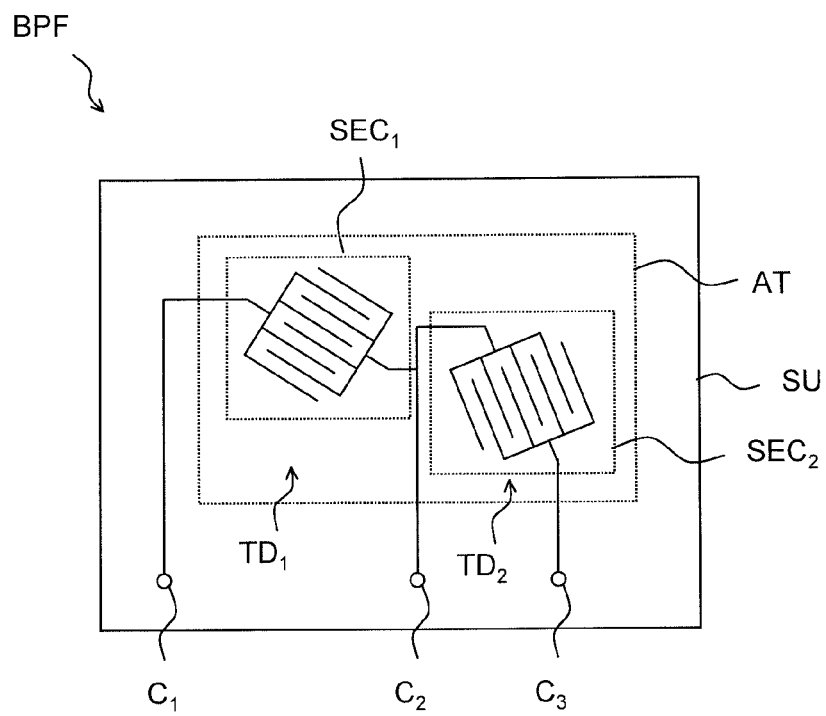
FIG. 1 shows a schematic arrangement of two transducers on a substrate.

FIG. 1 shows a bandpass filter BPF having a first section $SEC_1$ and a second section $SEC_2$, which are arranged in an acoustic track AT. The first section $SEC_1$ is substantially realized by a first transducer $TD_1$ and the second section $SEC_2$ is substantially realized by a second transducer $TD_2$. However, it is also possible, see, e.g., FIG. 2, for the two sections $SEC_1$ and $SEC_2$ to be arranged in the same transducer.

The acoustic track AT is arranged on a substrate SU. It is possible for the substrate to be a carrier substrate having a piezoelectric layer deposited thereon. However, it is also possible for the substrate itself to be piezoelectric and to constitute the piezoelectric layer.

The two transducers $TD_1$ and $TD_2$ are connected to three connections $C_1$, $C_2$, $C_3$. It is possible for one of the two transducers, e.g., $TD_1$, to be a series branch transducer. In that case, the connection $C_1$ could constitute a signal input and the connection $C_2$ could constitute a signal output connection. The transducer $TD_2$ is then a parallel branch resonator and the connection $C_2$ is interconnected with ground. The two transducers $TD_1$ and $TD_2$ then substantially constitute a basic element of a ladder-type circuit.

Figure 2:
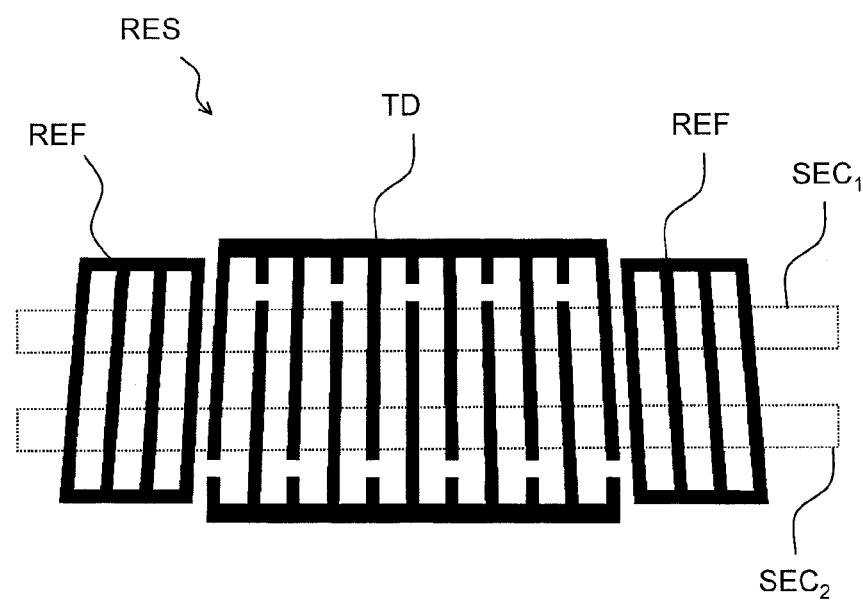
FIG. 2 shows a FAN-type transducer.

FIG. 2 shows a configuration comprising one FAN-type transducer TD between two reflectors REF. In this case, the finger spacings of the reflector fingers can increase or decrease along the transverse direction. However, the finger spacings can also remain constant. The two sections $SEC_1$ and $SEC_2$ are formed by regions of the FAN-type transducer TD that extend parallel. In contrast with FIG. 1, therefore, FIG. 2 illustrates the situation with both sections within the same transducer, namely a complete FAN-type transducer.

Figure 3:
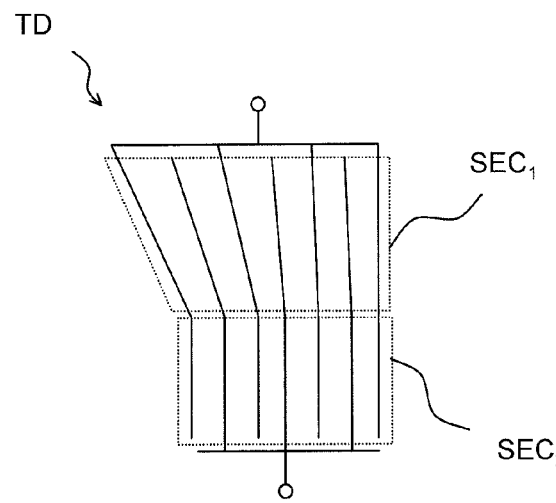
FIG. 3 shows a partial FAN-type transducer.

FIG. 3 schematically shows a partial FAN-type transducer TD having a first region with a constant pitch, which realizes e.g., the second section $SEC_2$, and also a section with a variable pitch, which realizes the first section $SEC_1$.

Figure 4:
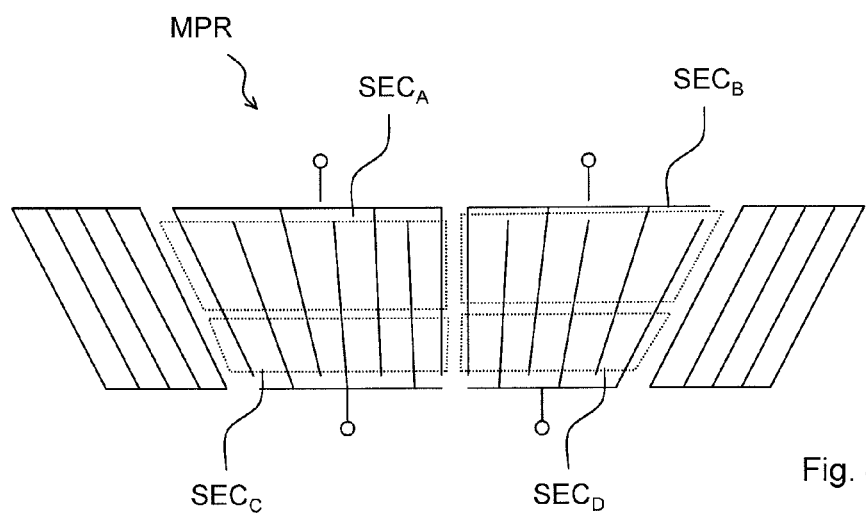
FIG. 4 shows a resonator having two FAN-type transducers between two reflectors.

FIG. 4 shows a multi-port resonator MPR comprising two FAN-type transducers. Each of the transducers has at least two regions having different pitches. Overall, therefore, at least the four transducer segments $SEC_a$, $SEC_b$, $SEC_c$, $SEC_d$, are obtained, from which the first transducer segment and the second transducer segment can be selected.

In this case, the two transducers of the multiport resonator MPR are arranged between two reflector structures.

Figure 5:
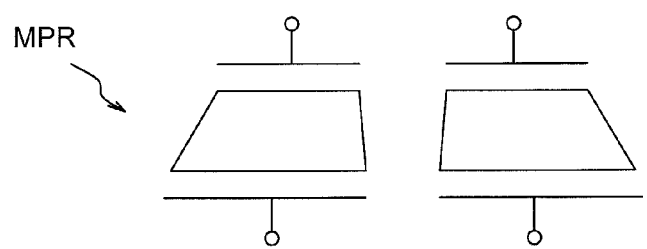
FIG. 5 shows a schematic illustration of two juxtaposed FAN-type transducers.

FIG. 5 in this case illustrates the symbolic representation of the FAN-type transducers from FIG. 4.

Figure 6:
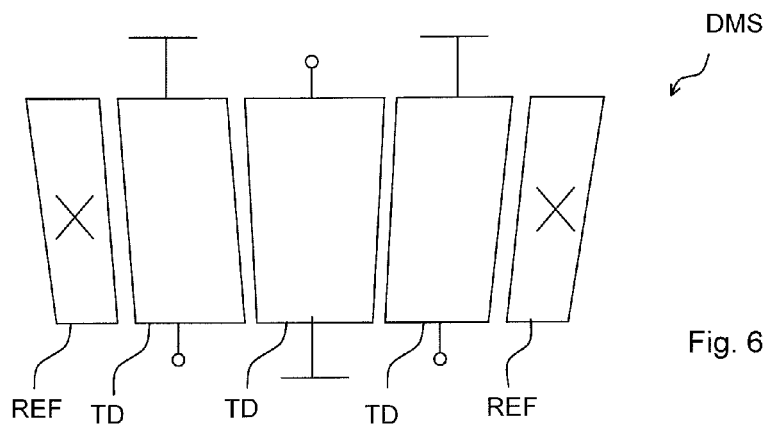
FIG. 6 shows a DMS structure having three FAN-type transducers.

FIG. 6 schematically shows a DMS structure (DMS=dual mode SAW) comprising three transducers TD between two reflectors REF. One of the three transducers, e.g., the central transducer, can in this case be an input transducer, while the two other transducers are output transducers. However, it is also possible for the inner transducer to be an output transducer, while the two outer transducers are input transducers.

Figure 7:
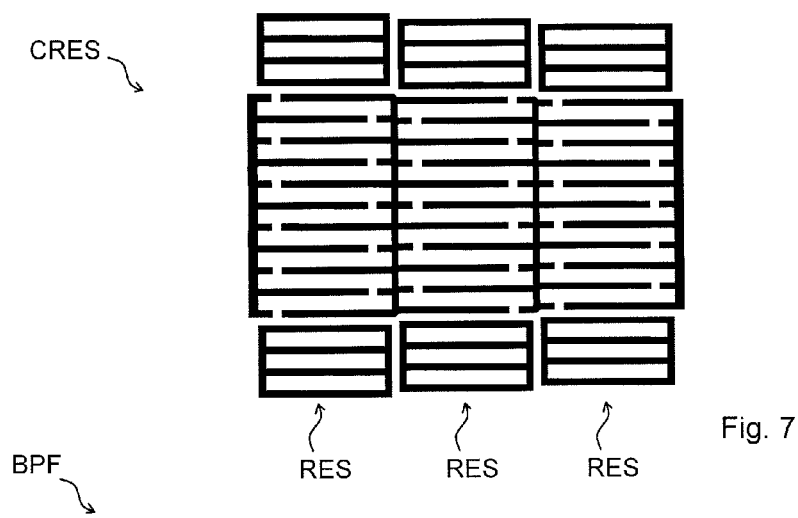
FIG. 7 shows a triply cascaded resonator having three partial resonator structures.

FIG. 7 shows a triple resonator cascade CRES, in which three transducer segments are arranged alongside one another and in each case between two reflector elements and are interconnected in series. In this case, the pitches of the cascade stages can be set such that undesirable spikes in the transfer function mutually compensate for one another.

Figure 8:
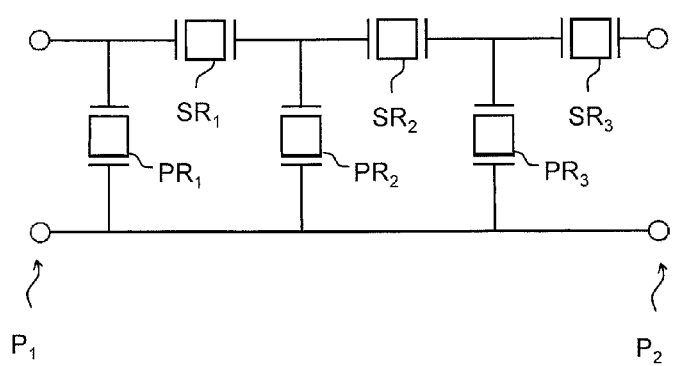
FIG. 8 shows a ladder-type filter structure.

FIG. 8 symbolizes a ladder-type filter structure comprising a first series branch transducer $SR_1$, a second series branch transducer $SR_2$ and a third series branch transducer $SR_3$, which are connected in series with one another. In parallel with each individual series branch resonator, a parallel branch resonator, here the first parallel branch resonator $PR_1$, the second parallel branch resonator $PR_2$ and the third parallel branch resonator $PR_3$, is connected relative to ground. The bandpass filter BPF has a first port $P_1$ and a second port $P_2$, which constitute the input port and output port, respectively.

Figure 9:
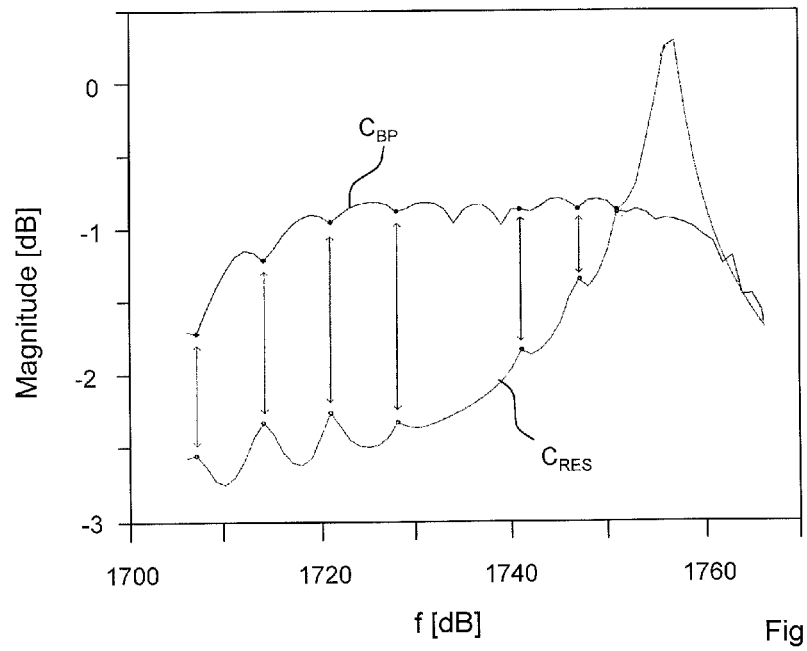
FIG. 9 shows the effect of Fabry-Perot resonances on the admittance of a resonator and the corresponding insertion loss of a bandpass filter.

FIG. 9 shows the negative effects of Fabry-Perot resonances. In this case the curve $C_{RES}$ represents the real part of the admittance of a resonator in a bandpass filter. The curve $C_{BP}$ represents the insertion loss of a bandpass filter having the resonator associated with the curve $C_{RES}$. The superimposition of partial waves reflected at the edges of the resonator fingers gives rise to Fabry-Perot resonances, the local maxima of which are identified by the arrows. Since the insertion loss of the bandpass filter is dependent on the admittance of the individual resonators, the Fabry-Perot resonances are also reflected again in a ripple in the passband. In order to reduce the ripple of the passband, the Fabry-Perot resonances of different resonators or transducer segments can be chosen such that a mutual compensation occurs and the ripple of the insertion loss is significantly reduced in the entire passband characteristic.

Figure 10:
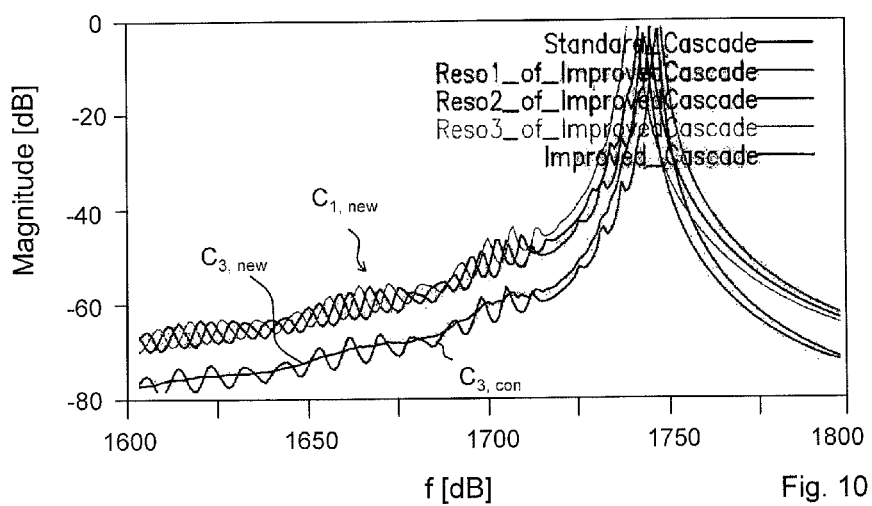
FIG. 10 shows the real part of the oscillation behavior of an optimized triple cascade.

FIG. 10 shows the response function $C_{3,CON}$ of a conventional triple cascade. In contrast thereto, $C_{3,new}$ indicates a response function of an improved ripple cascade characterized by a significantly reduced ripple. The significantly reduced ripple is obtained by virtue of the position of the individual resonances of the three individual cascades $C_{1,new}$ being chosen such that a destructive interference is obtained. The ripple of an insertion loss of a bandpass filter having such a triple cascade is correspondingly likewise reduced.

Figure 11:
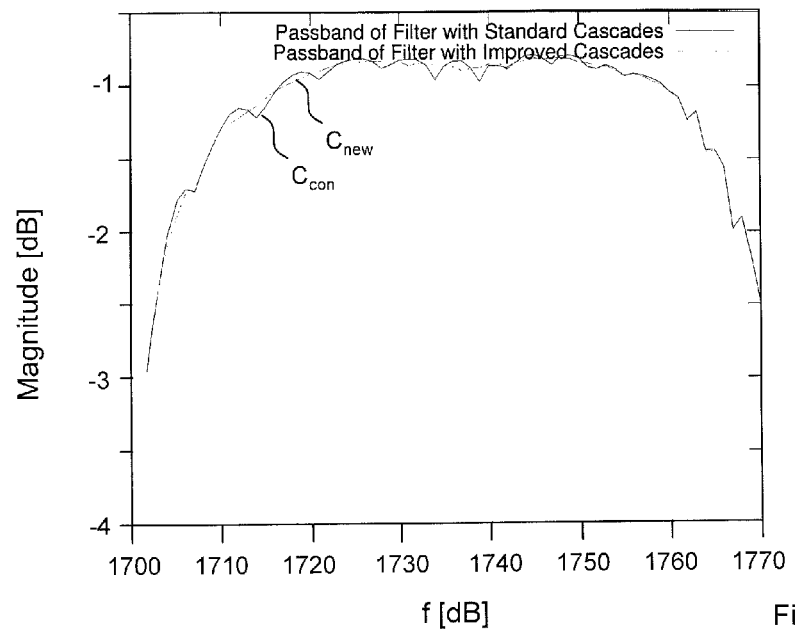
FIG. 11 shows an insertion loss in the passband with reduced ripple.

FIG. 11 shows the insertion loss of a conventional bandpass filter $C_{con}$ compared with the insertion loss with reduced ripple $C_{new}$.

Figure 12:
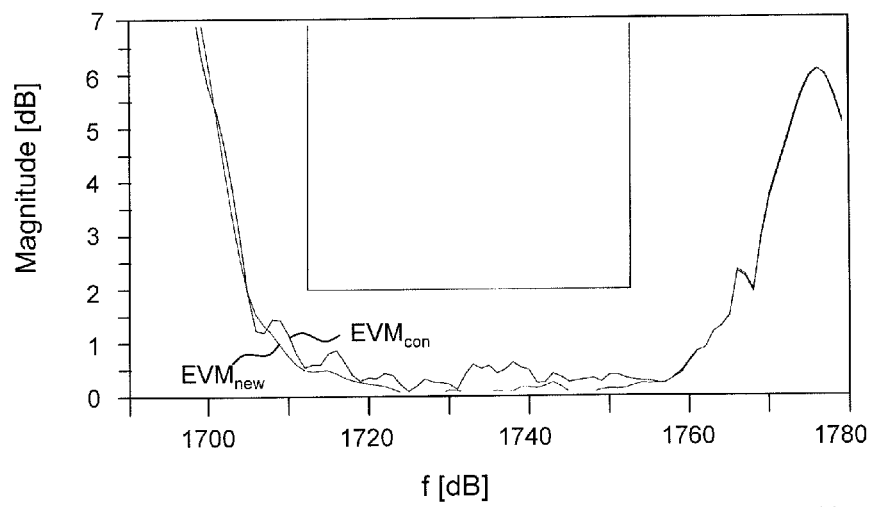
FIG. 12 shows the Error Vector Magnitude (EVM) for a conventional filter and for an improved filter.

FIG. 12 shows the Error Vector Magnitude (EVM) for a conventional filter $EVM_{con}$ and by an improved filter $EVM_{new}$. The EVM describes the average vector deviation of a received modulated symbol from the correct value in the constellation diagram. The EVM is increased as a result of the distortion of the signal in the filter on account of the deviation from the ideal rectangular waveform. In other words, the EVM describes the influence of the filter on the signal quality and is therefore a measure of the smoothness of the filter. It is clearly evident that the improved filter has a smaller EVM and a smoother filter characteristic.

Figure 13:
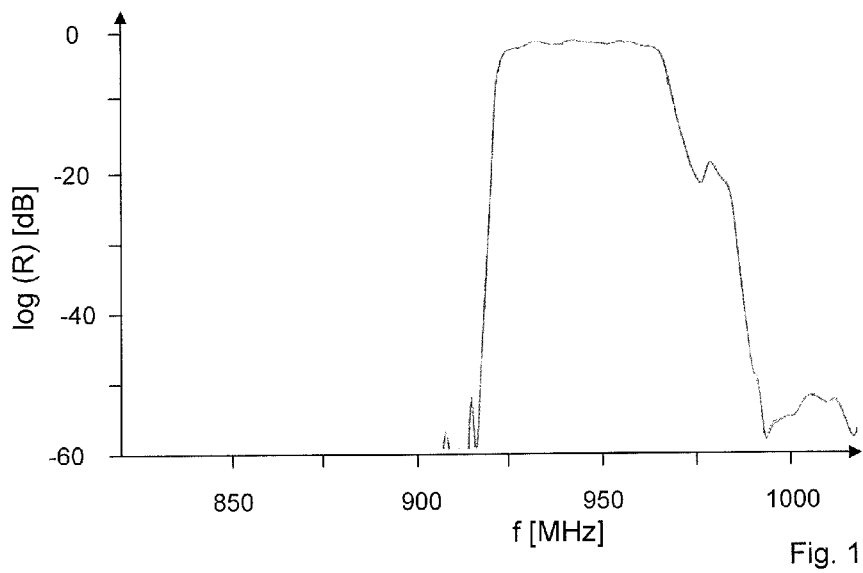
FIG. 13 shows the insertion loss of an optimized filter.

FIG. 13 shows the insertion loss of a conventional and an optimized bandpass filter.

Figure 14:
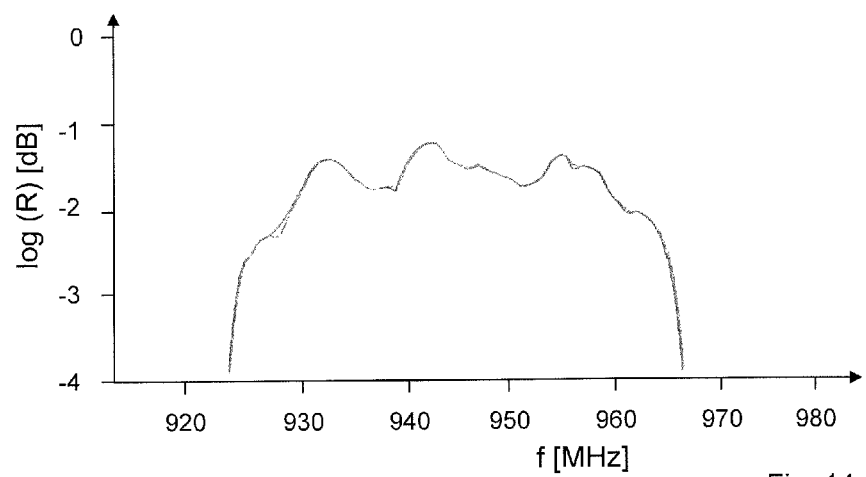
FIG. 14 shows an excerpt from the insertion loss shown in FIG. 13.

FIG. 14 shows an enlarged view of the passband range from FIG. 13.

In this case, FIGS. 13 and 14 show a filter structure which has per se only little ripple in the passband. It emerges that measures which yield a significant improvement in less optimized filters, in the case of a characteristic that is already good, do not disadvantageously influence the latter.

Figure 15:
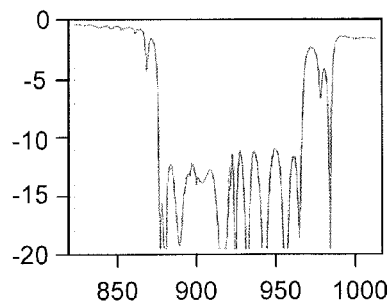
FIG. 15 shows the reflection at one of two ports for a conventional filter and for an optimized filter.

FIG. 15 shows the reflection at one of two ports for a conventional and for an optimized filter.

Figure 16:
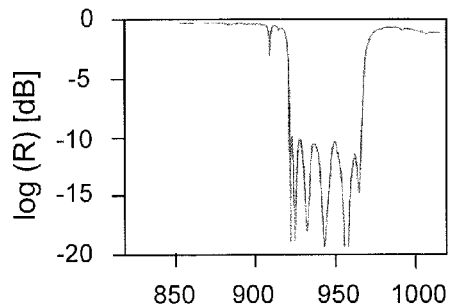
FIG. 16 shows the reflection at the corresponding other port of the filters from FIG. 15.

FIG. 16 shows the reflection at the corresponding other port of the filters.

FIGS. 15 and 16 show the adaptation of a corresponding filter structure into an external circuit embodiment. It is evident that no impairment of the adaptation is afforded by the measures for improving the filter characteristic.

Figure 17:
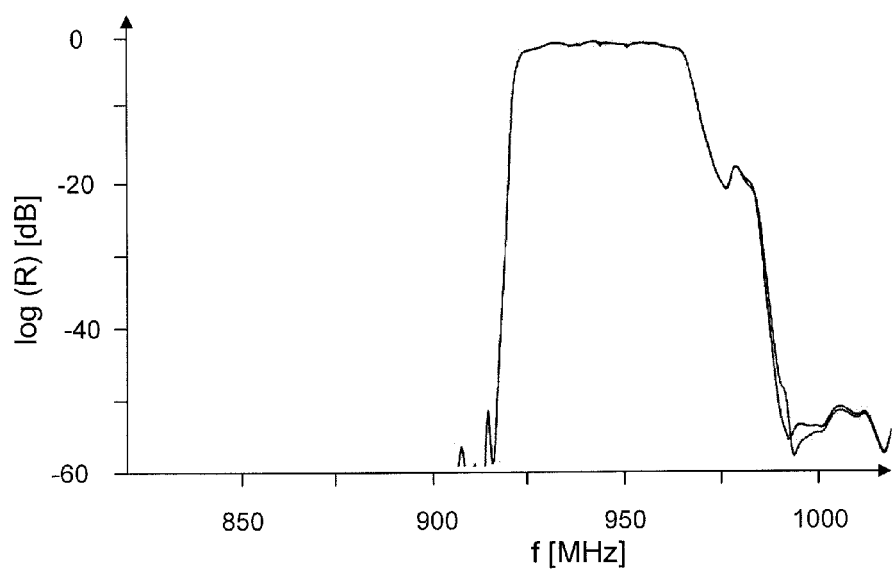
FIG. 17 shows the calculated transfer functions of a bandpass filter having resonator structures and a DMS track.

FIG. 17 shows calculated transfer functions of a bandpass filter having resonator structures and a DMS track. In the smoother of the two curves, spike frequencies were chosen correspondingly advantageously.

FIG. 18 shows an excerpt from the curve in FIG. 17.

In this case, FIGS. 17 and 18 show a filter structure which has per se only little ripple in the passband. It emerges that measures which yield a significant improvement in less optimized filters, in the case of a characteristic that is already good, do not disadvantageously influence the latter.

FIGS. 19 and 20 show the adaptation of a corresponding filter structure into an external circuit embodiment. It is evident that no impairment of the adaptation is afforded by the measures for improving the filter characteristic.

The bandpass filter according to the invention is not restricted to any of the exemplary embodiments described. Combinations of transducer segments and further filter structures likewise constitute exemplary embodiments according to the invention.

The invention claimed is:

1. An electroacoustic bandpass filter comprising:
a piezoelectric layer having an acoustic track; and
a metallization layer arranged on the piezoelectric layer and in the acoustic track;
wherein the acoustic track comprises a first section and a second section;
wherein in the first section, a first transducer segment is formed in the metallization layer, the first transducer segment forming a resonance at a first frequency $f_1$ and generating a spike in insertion loss;
wherein in the second section, a second transducer segment is formed in the metallization layer, the second transducer segment forming a resonance at a second frequency $f_2$ and generating a spike in insertion loss, where $f_2 \neq f_1$; and
wherein the frequencies $f_1$ and $f_2$ are chosen such that the manifestation of the spikes in insertion loss of the filter is reduced compared with the manifestation of the spikes of the individual transducer segments.

2. The electroacoustic bandpass filter according to claim 1, wherein the first transducer segment is part of a first transducer and the second transducer segment is part of a second transducer, the first and second transducers being different frequency-offset transducers.

3. The electroacoustic bandpass filter according to claim 2, wherein the first and second transducers are cascaded and interconnected in series or in parallel.

4. The electroacoustic bandpass filter according to claim 3, wherein the first and second transducers are part of a resonator cascade with a common busbar.

5. The electroacoustic bandpass filter according to claim 1, wherein the first transducer segment and the second transducer segment are two segments of the same transducer.

6. The electroacoustic bandpass filter according to claim 5, wherein the first transducer segment and the second transducer segment are two segments of a FAN-type transducer.

7. The electroacoustic bandpass filter according to claim 1, wherein the filter is a SAW filter or a GBAW filter.

8. The electroacoustic bandpass filter according to claim 1, wherein:
the first transducer segment and the second transducer segment are arranged in a first transducer; and
the filter comprises a second transducer and is a DMS filter or a multi-port resonator filter.

9. The electroacoustic bandpass filter according to claim 1, further comprising a reflector, which is configured as a FAN-type reflector.

10. The electroacoustic bandpass filter according to claim 9, wherein the FAN-type reflector has a pitch scaling of between 500 ppm and 2000 ppm.

11. The electroacoustic bandpass filter according to claim 9, wherein the piezoelectric layer has an underside which at least partly reflects bulk acoustic waves and the FAN-type reflector is provided for scattering bulk acoustic waves in order to reduce the ripple of the insertion loss.

12. The electroacoustic bandpass filter according to claim 1, wherein the filter is a DMS filter and the transducer is a partial FAN-type transducer or a complete FAN-type transducer.

13. The electroacoustic bandpass filter according to claim 12, further comprising a third transducer, wherein the first transducer, the second transducer and the third transducer are FAN-type transducers, and wherein two of the transducers are output transducers and one of the transducers is an input transducer arranged between the output transducers.

14. The electroacoustic bandpass filter according to claim 13, wherein the piezoelectric layer has an underside which at least partly reflects bulk acoustic waves and the FAN-type transducers are provided for scattering bulk acoustic waves in order to reduce the ripple of the insertion loss.

15. The electroacoustic bandpass filter according to claim 1, further comprising a parallel branch transducer having a pitch $P_2$, wherein one of the first and second transducer segments is arranged in a series branch transducer having a pitch $P_1$ and $P_2 > P_1$.

16. The electroacoustic bandpass filter according to claim 1, wherein the frequencies $f_1$ and $f_2$ are chosen such that undesirable Fabry Perot resonances are reduced.

* * * * *